(12) United States Patent
Yang et al.

(10) Patent No.: US 10,277,969 B2
(45) Date of Patent: Apr. 30, 2019

(54) MICROPHONE DEVICE

(71) Applicant: Fortemedia, Inc., Santa Clara, CA (US)

(72) Inventors: Tsung-Lung Yang, Hsinchu (TW); Hsin-Li Lee, Tainan (TW); Neng-Bin Wan, Shenzhen (CN)

(73) Assignee: FORTEMEDIA, INC., Santa Clara, CA (US)

( * ) Notice: Subject to any disclaimer, the term of this patent is extended or adjusted under 35 U.S.C. 154(b) by 8 days.

(21) Appl. No.: 15/667,693

(22) Filed: Aug. 3, 2017

(65) Prior Publication Data
US 2018/0359551 A1    Dec. 13, 2018

(30) Foreign Application Priority Data

Jun. 7, 2017    (CN) .......................... 2017 1 0422082

(51) Int. Cl.
| | | |
|---|---|---|
| *H04R 9/08* | (2006.01) | |
| *H04R 1/08* | (2006.01) | |
| *H04R 31/00* | (2006.01) | |
| *H04R 19/00* | (2006.01) | |
| *B81B 7/00* | (2006.01) | |
| *B81C 1/00* | (2006.01) | |
| *H04R 1/04* | (2006.01) | |
| *H04R 1/40* | (2006.01) | |
| *H04R 19/04* | (2006.01) | |

(52) U.S. Cl.
CPC .......... *H04R 1/083* (2013.01); *B81B 7/0006* (2013.01); *B81C 1/00253* (2013.01); *H04R 1/04* (2013.01); *H04R 1/406* (2013.01); *H04R 19/005* (2013.01); *H04R 31/006* (2013.01); *H04R 19/04* (2013.01); *H04R 2201/003* (2013.01)

(58) Field of Classification Search
CPC combination set(s) only.
See application file for complete search history.

(56) References Cited

U.S. PATENT DOCUMENTS

| | | | | |
|---|---|---|---|---|
| 2003/0034563 A1* | 2/2003 | Reyes | ..................... | H01L 24/49 257/777 |
| 2006/0147061 A1* | 7/2006 | Niwa | ........................ | H03F 1/30 381/113 |
| 2014/0161295 A1* | 6/2014 | Huang | .................... | H04R 1/406 381/357 |
| 2014/0348370 A1* | 11/2014 | Huang | ..................... | H04R 1/08 381/361 |

* cited by examiner

*Primary Examiner* — Amir H Etesam
(74) *Attorney, Agent, or Firm* — McClure, Qualey & Rodack, LLP

(57) ABSTRACT

A microphone device is provided. The microphone device includes a microphone cover, a circuit board, an integrated circuit, a first acoustic sensor, and a second acoustic sensor. The circuit board is coupled to the microphone cover. The circuit board includes a first acoustic port and a second acoustic port. The integrated circuit is coupled to the microphone cover and the circuit board to form a first chamber and a second chamber. The first acoustic sensor is arranged in the first chamber. The second acoustic sensor is arranged in the second chamber. The integrated circuit is coupled to the first acoustic sensor and the second acoustic sensor.

7 Claims, 15 Drawing Sheets

MICROPHONE DEVICE

CROSS REFERENCE TO RELATED APPLICATIONS

This Application claims priority of China Patent Application No. 201710422082.2, filed on Jun. 7, 2017, the entirety of which is incorporated by reference herein.

BACKGROUND OF THE INVENTION

Field of the Invention

The present invention relates to a microphone device.

Description of the Related Art

Currently, most microphone devices are capacitive microphones in which micro-electro mechanical system (MEMS) microphones are widely used. A MEMS microphone uses MEMS, which can integrate electronic, electrical, and mechanical functions into a single device. Therefore, a MEMS microphone may have the advantages of a small size, low power consumption, easy packaging, and resistance to interference.

In general, a microphone device having multiple acoustic sensors (e.g., a MEMS microphone) can perform with better sensitivity and have a better noise-to-signal ratio. Adopting multiple acoustic sensors may increase the total size of the microphone device and affect the applications of the microphone device. Therefore, the package of the microphone device can be designed to extend the applications of the microphone device.

BRIEF SUMMARY OF THE INVENTION

A detailed description is given in the following embodiments with reference to the accompanying drawings.

The present disclosure provides a microphone device. The microphone device comprises a microphone cover, a circuit board, an integrated circuit, a first acoustic sensor, and a second acoustic sensor. The circuit board is coupled to the microphone cover and comprises a first acoustic port and a second acoustic port. The integrated circuit is coupled to the microphone cover and the circuit board to form a first chamber and a second chamber. The first acoustic sensor is placed inside the first chamber, and the second acoustic sensor is placed inside the second chamber. The integrated circuit is coupled to the first acoustic sensor and the second acoustic sensor.

The present disclosure provides a microphone device. The microphone device comprises a microphone cover, a circuit board, an integrated circuit, a first acoustic sensor, a second acoustic sensor, and a sound transmission device. The circuit board is coupled to the microphone cover and comprises a first acoustic port and a second acoustic port. The integrated circuit is coupled to the microphone cover and the circuit board to form a first chamber and a second chamber. The first acoustic sensor is placed inside the first chamber. The second acoustic sensor is placed inside the second chamber. The sound transmission device comprises a third acoustic port, a fourth acoustic port, a first acoustic tube, and a second acoustic tube. The first acoustic tube communicates with the first acoustic port and the third acoustic port, and the second acoustic tube communicates with the second acoustic port and the fourth acoustic port. The integrated circuit is coupled to the first acoustic sensor and the second acoustic sensor.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
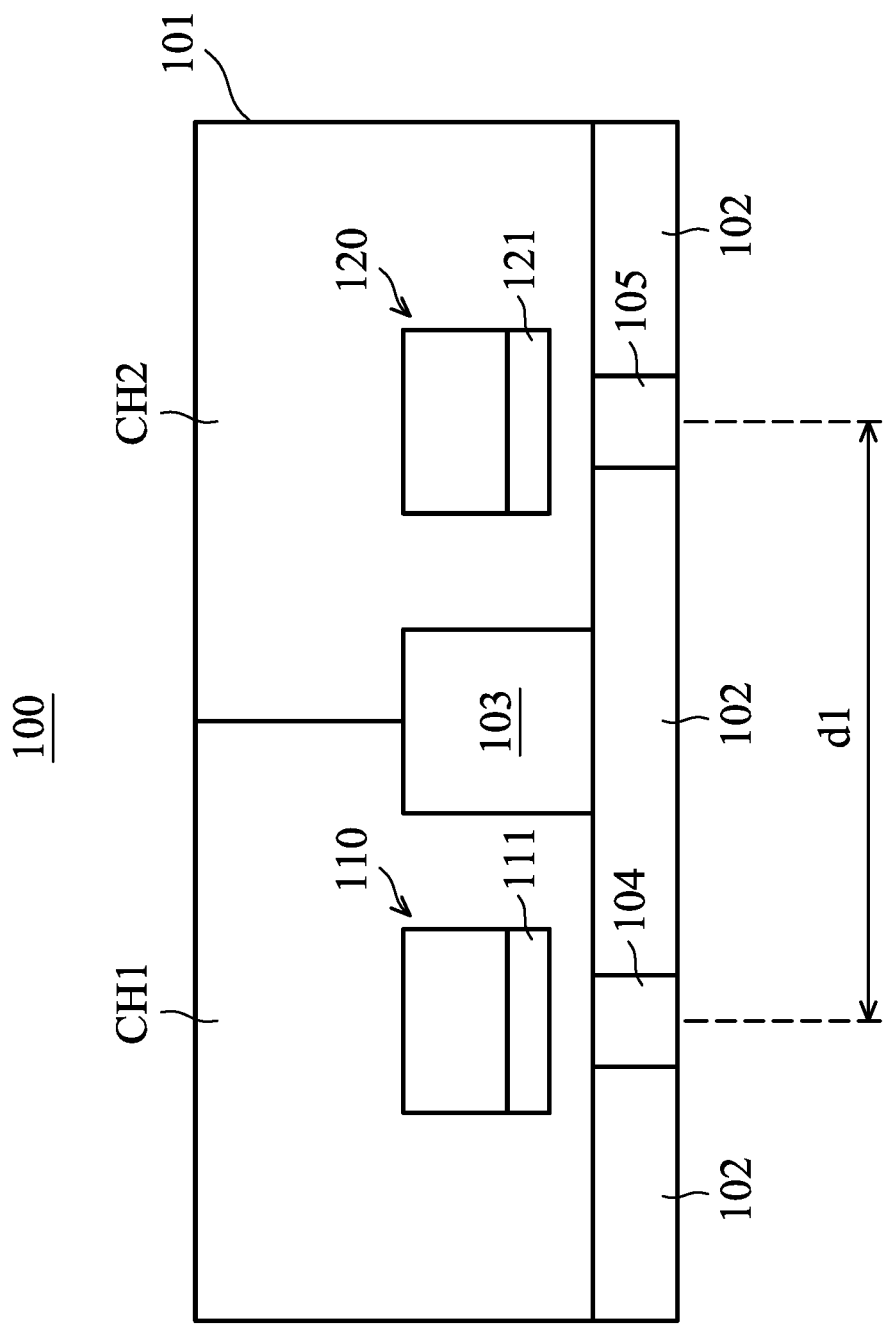
FIG. 1 is a schematic diagram of a microphone device according to some embodiments of the present disclosure.

FIG. 1 is a schematic diagram of the microphone device 100 according to some embodiments of the present disclosure. The microphone device 100 includes the microphone cover 101, circuit board 102, integrated circuit 103, acoustic sensor 110, and acoustic sensor 120. The integrated circuit 103 is coupled to the microphone cover 101 and the circuit board 102 to form the chamber CH1 and chamber CH2. The acoustic sensor 110 in the chamber CH1 includes diaphragm 111. The acoustic sensor 120 in the chamber CH2 includes diaphragm 121. The circuit board 102 is coupled to the microphone cover 101 and includes the acoustic port 104 and acoustic port 105.

In some embodiments, the acoustic sensors 110 and 120 are micro-electro mechanical system (MEMS) devices. In some embodiments, the integrated circuit 103 includes the digital circuit (e.g., the circuit which can perform digital-signal-processing (DSP)), analog circuit (e.g., operational amplifier), and analog/digital convertor.

In some embodiments, the digital circuit of the integrated circuit 103 may have built-in algorithms (such as Time Difference of Arrival (TDOA), Differential Microphone Arrays (DMA), or Adaptive Differential Microphone Arrays (ADMA) Algorithm) to allow the microphone device 100 to support lots of functions. For example, based on parameters (such as the noise, background sound) corresponding to the environment outside the microphone device 100, the digital circuit of the microphone device 100 may automatically change the noise-to-signal ratio (SNR), dynamic range, and direction or angle of the directivity of the microphone device 100 using the aforementioned algorithm, such as switching to a better SNR or switching to a wider dynamic range. Furthermore, the analog circuit (e.g., the operational amplifier) of the integrated circuit 103 may respectively provide the same or different voltages to the acoustic sensors to adjust sensitivity and volume gain of the microphone device 100.

In some embodiments, the integrated circuit 103 is coupled to the acoustic sensors 110 and 120. The integrated circuit 103 can provide voltages to the acoustic sensors 110 and 120 and process signals (generated by the sound) received from the acoustic sensors 110 and 120. In some embodiments, the integrated circuit 103 may provide different respective voltages to the acoustic sensor 110 and the acoustic sensor 120, which makes the distance between the diaphragm 111 and the back-plate (not shown in FIG. 1) of the acoustic sensor 110 different from the distance between the diaphragm 121 and the back-plate (not shown in FIG. 1) of the acoustic sensor 120. In such cases, the sensitivity of the acoustic sensor 110 is different from the sensitivity of the acoustic sensor 120, which increases the dynamic range of the microphone device 100. In some embodiments, the size of the diaphragm 111 and the size of the diaphragm 121 are different, so the rigidity of the diaphragm 111 and the rigidity of the diaphragm 121 are also different, which makes the sensitivity of the acoustic sensor 110 different from the sensitivity of the acoustic sensor 120 and increases the dynamic range of the microphone device 100.

In some embodiments, the integrated circuit 103 may provide the same voltage to the acoustic sensor 110 and the acoustic sensor 120, which makes the distance between the diaphragm 111 and the back-plate (not shown in FIG. 1) of the acoustic sensor 110 the same as the distance between the diaphragm 121 and the back-plate (not shown in FIG. 1) of the acoustic sensor 120. In such cases, the sensitivity of the acoustic sensor 110 is the same as the sensitivity of the acoustic sensor 120, which improves the SNR of the microphone device 100. In some embodiments, the integrated circuit 103 can dynamically adjust the volume gain of the microphone device 100 to let the acoustic overload point (AOP) be 140 dB.

As shown in FIG. 1, the acoustic port 104 corresponds to the position of the diaphragm 111 (which makes the diaphragm 111 can receive sound through the acoustic port 104), and the acoustic port 105 corresponds to the position of the diaphragm 121 (which makes the diaphragm 121 can receive sound through the acoustic port 105). In some embodiments, the first sound wave transmitted from outside of the microphone device 100 may transmit to the acoustic sensors 110 and 120 through the acoustic ports 104 and 105, respectively. Based on the distance d1 between the acoustic ports 104 and 105, a first part and a second part of the first sound wave may respectively reach the diaphragm 111 and diaphragm 121 at the same time if the first sound wave is transmitted in a specific direction, which makes the microphone device 100 perform directivity. In some embodiments, the distance d1 is the distance between the central points of the acoustic ports 104 and 105.

In some embodiments, the integrated circuit 103 may control the directivity of the microphone device 100 by controlling the acoustic sensor 110 and acoustic sensor 120 and processing the signals received from the acoustic sensor 110 and acoustic sensor 120. For example, the integrated circuit 103 may add an additional delay to the signal received from the acoustic sensor 110 or the acoustic sensor 120 to automatically adjust the directivity of the microphone device 100. In some embodiments, the integrated circuit 103 uses the TDOA algorithm to perform better speech-recognition function.

In some embodiments, the sound wave propagated from the acoustic port 104 to the diaphragm 111 (e.g., the first part of the first sound wave) is not transmitted to the diaphragm 121, and the sound wave propagated from the acoustic port 105 to the diaphragm 121 (e.g., the second part of the first sound wave) is not transmitted to the diaphragm 111. In such cases, the acoustic sensor 110 of the chamber CH1 is not interrupted by the sound wave transmitted to the acoustic sensor 120 of the chamber CH2. Similarly, the acoustic sensor 120 of the chamber CH2 is not interrupted by the sound wave transmitted to the acoustic sensor 110 of the chamber CH1. Accordingly, the noise respectively received by the acoustic sensors 110 and 120 is reduced, and the performance of the directivity of the microphone device 100 is improved.

As shown in FIG. 1, since the microphone device 100 can control the acoustic sensors 110 and 120 through a single integrated circuit 103, the package size of the microphone device 100 which adopts multiple acoustic sensors (e.g., the acoustic sensors 110 and 120) can be reduced. Moreover, since the integrated circuit 103 of the microphone device 100 is designed as one of the components which forms the chambers CH1 and CH2 (e.g., the integrated circuit 103 is coupled to the microphone cover 101 and the circuit board 102), the wall structure generally utilized to form the chambers CH1 and CH2 is replaced by the part of the integrated circuit 103, which further reduces the size of the microphone device 100.

In some embodiments, the arrangement (e.g., the arrangement of the acoustic sensor 110 and the integrated circuit 103) in the chamber CH1 is the same as the arrangement (e.g., the arrangement of the acoustic sensor 120 and the integrated circuit 103) in the chamber CH2, which improves the directivity of the microphone device 100. Because the integrated circuit 103 of the microphone device 100 is designed as one of the components which form the chambers CH1 and CH2, the circuit arrangement in the chamber CH1 and the circuit arrangement in the chamber CH2 can be designed to be the same as each other without placing an individual integrated circuit in each chamber (e.g., chambers CH1 and CH2). Accordingly, in the case that the circuit arrangement in the chamber CH1 and the circuit arrangement in chamber CH2 are designed to be identical to each other, the size of the microphone device 100 can be reduced by making the integrated circuit 103 of the microphone device 100 one of the components which form the chambers CH1 and CH2.

Figure 2:
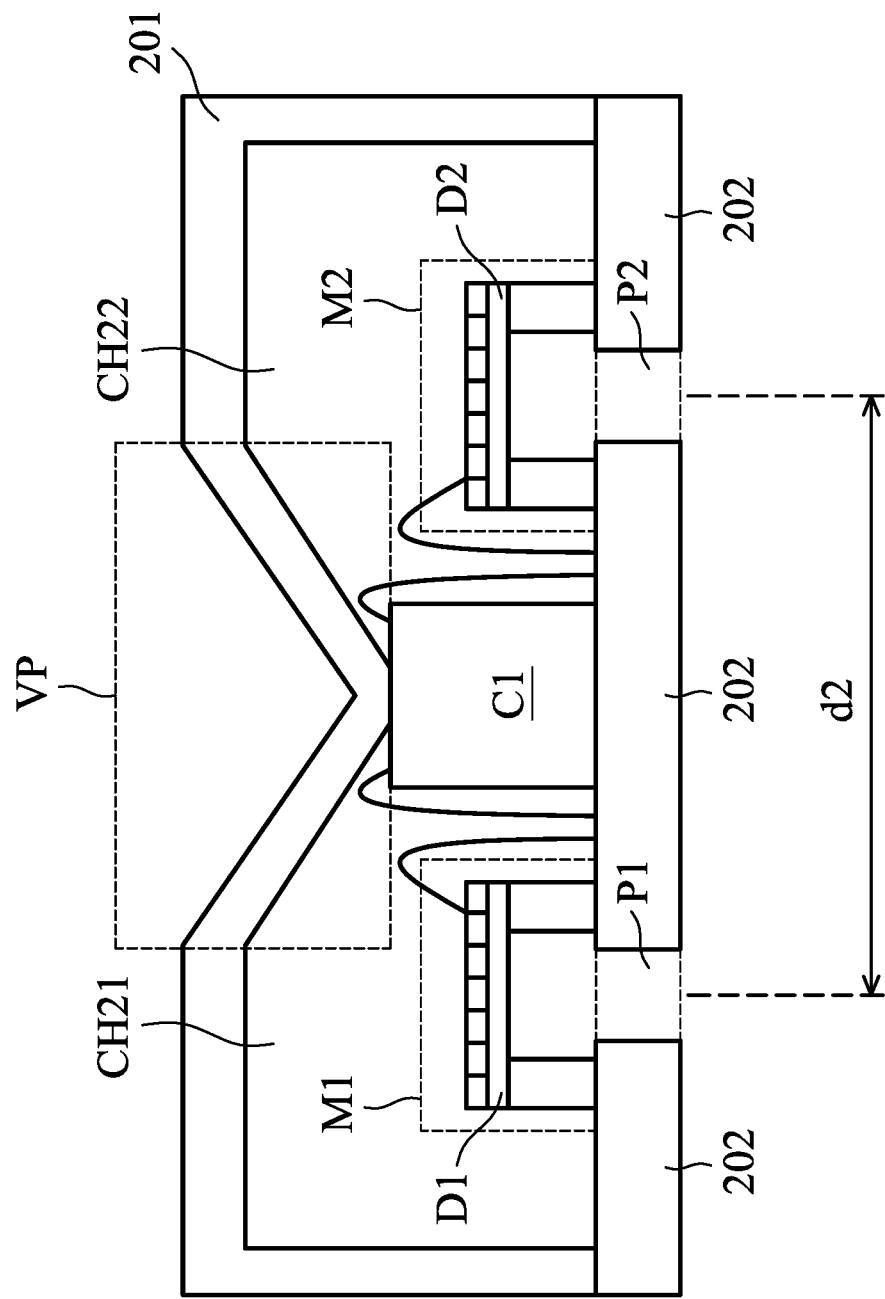
FIG. 2 is a schematic diagram of a microphone device according to some embodiments of the present disclosure.

In some embodiments, the microphone device 100 can be implemented as the microphone device 200 in FIG. 2. The microphone device 200 includes the microphone cover 201, circuit board 202, integrated circuit C1, acoustic sensor M1, and acoustic sensor M2. As shown in FIG. 2, the microphone cover 201 includes the groove VP. The integrated circuit C1 is coupled to the groove VP of the microphone cover 201 and the circuit board 202 to form the chambers CH21 and CH22. The acoustic sensor M1 in the chamber CH21 includes the diaphragm D1. The acoustic sensor M2 in the chamber CH22 includes the diaphragm D2. The circuit board 202 is coupled to the microphone cover 201. The circuit board 202 includes the acoustic ports P1 and P2, and the acoustic port P1 is spaced apart from the acoustic port P2 by the distance d2.

In some embodiments, the integrated circuit C may be directly connected to the acoustic sensors M1 and M2. In some embodiments, the integrated circuit C1 may be connected to the circuit board 202 through a conductive feature (or a conductive wire), and then be coupled to the acoustic sensors M1 and M2 through another conductive feature to control the acoustic sensors M1 and M2.

In some embodiments, the material of the microphone cover 201 is metal. Therefore, the microphone cover 201 can be extended by receiving a force (e.g., by being pressed) to directly form the groove VP on the microphone cover 201. On the other hand, if the material of the microphone cover 201 is metal, the thickness of the microphone cover 201 can be reduced and still have enough rigidity, which reduces the size of the microphone device 200.

In some embodiments, since the integrated circuit C1 of the microphone device 200 is designed as one of the components which forms the chambers CH21 and CH22 (e.g., the integrated circuit C1 is coupled to the microphone cover 201 and the circuit board 202), the wall structure generally utilized to form the chambers CH21 and CH22 is replaced by the part of the integrated circuit C1, which reduces the size of the microphone device 200.

In some embodiments, the chambers CH21 and CH22 are the same size. Furthermore, the arrangement of the acoustic sensor M1 and the integrated circuit C1 in the chamber CH21 is the same as the arrangement of the acoustic sensor M2 and the integrated circuit C1 in the chamber CH22. In such cases, the environment corresponding to the acoustic sensor M1 is substantially the same as the environment corresponding to the acoustic sensor M2. Therefore, when the integrated circuit C1 processes the signal received from the acoustic sensors M1 and M2 and performs a function related to the directivity of the microphone device 200, the effects caused by the difference between the environment of the acoustic sensors M1 and the environment of the acoustic sensors M2 can be reduced, which improves the accuracy of the directivity of the microphone device 200.

In some embodiments, the chambers CH21 and CH22 are the same size, and the arrangement of the acoustic sensor M1 and the integrated circuit C1 in the chamber CH21 is the same as the arrangement of the acoustic sensor M2 and the integrated circuit C1 in the chamber CH22. In such cases, the circuit arrangement in the chamber CH21 can be designed to be the same as the circuit arrangement in the chamber CH22 without placing an individual integrated circuit in each chamber (e.g., chambers CH21 and CH22). Therefore, the size of the microphone device 200 can be reduced.

Figure 3:
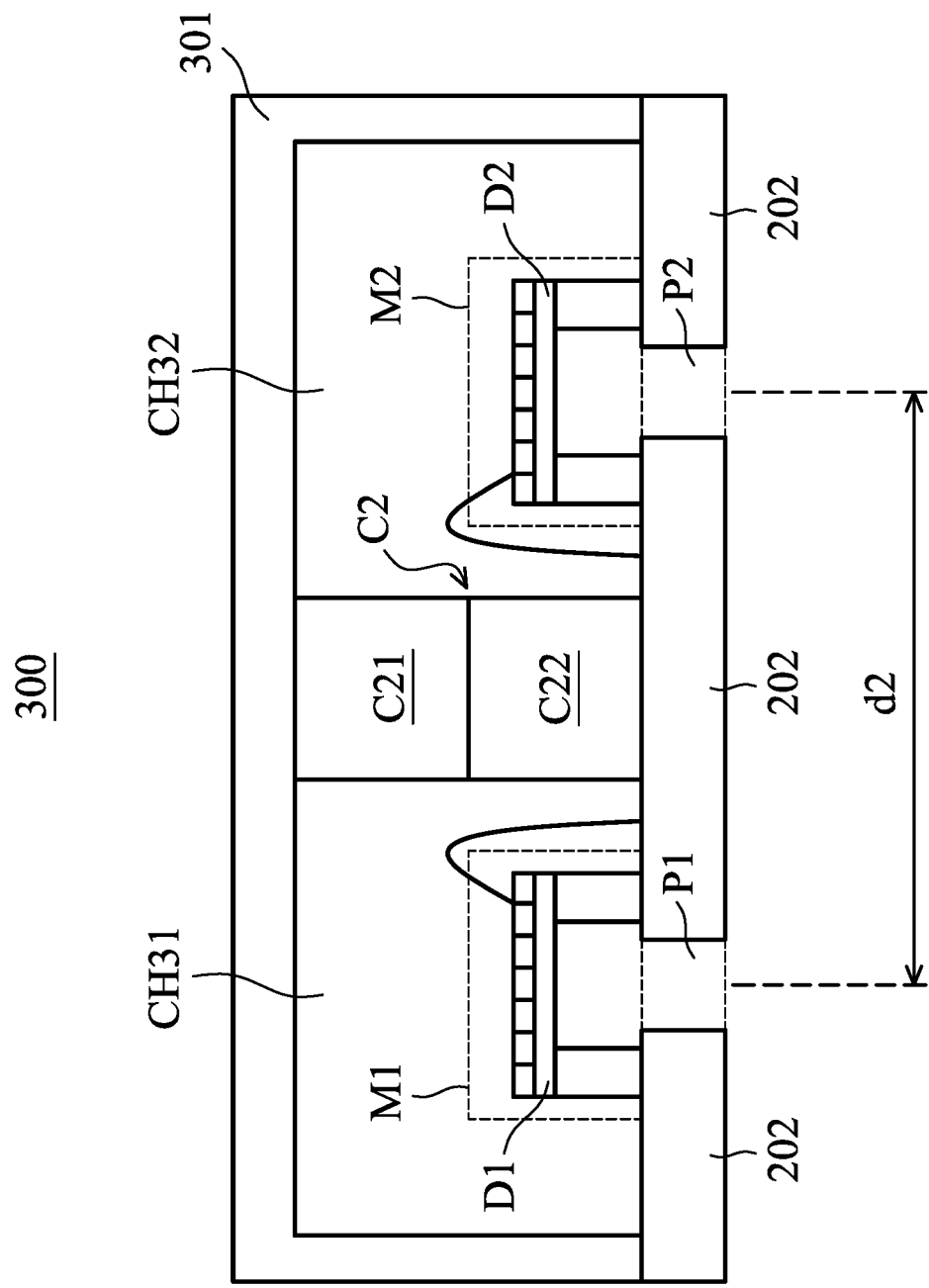
FIG. 3 is a schematic diagram of a microphone device according to some embodiments of the present disclosure.

In some embodiments, the microphone device 100 can be implemented as the microphone device 300 in FIG. 3. The microphone device 300 includes the microphone cover 301, circuit board 202, integrated circuit C2, acoustic sensor M1, and acoustic sensor M2. As shown in FIG. 3, the integrated circuit C2 includes electronic circuit C21 and electronic circuit C22. The electronic circuit C21 is coupled to the microphone cover 301, and the electronic circuit C22 is coupled to the circuit board 202, which forms the chambers CH31 and CH32. The acoustic sensor M1 in the chamber CH31 includes the diaphragm D1. The acoustic sensor M2 in the chamber CH32 includes the diaphragm D2. The circuit board 202 is coupled to the microphone cover 301. The circuit board 202 includes the acoustic ports P1 and P2, and the acoustic port P1 is spaced apart from the acoustic port P2 by the distance d2.

In some embodiments, the electronic circuit C21 and the electronic circuit C22 are coupled to each other by using the flip-chip technique. The integrated circuit C2 is coupled to the acoustic sensors M1 and M2 through the circuit board 202, and controls the acoustic sensors M1 and M2. In some embodiments, the electronic circuit C22 is coupled to the circuit board 202 by using the flip-chip technique.

In some embodiments, one of the electronic circuits C21 and C22 is the digital circuit. If the digital circuit of the integrated circuit C2 is independently provided in one of the electronic circuit C21 and the electronic circuit C22, the digital circuit of the integrated circuit C2 has a large effective circuit area (since it is not necessary to share the area with the analog circuit), which gives the microphone device 300 more computing ability and improves performance. In some embodiments, the performance of the integrated circuit C2 may be increased as the effective circuit area increases. For example, the storage capacity of the memory of the integrated circuit C2 may be increased based on a larger digital circuit area.

As shown in FIG. 3, the height of the microphone device 300 is the sum of the thickness of the circuit board 202, the height of the integrated circuit C2, and the thickness of the microphone cover 301. Therefore, the height of the microphone device 300 can be minimized. In some embodiments, if the material of the microphone cover 301 is metal, the thickness of the microphone cover 301 can be reduced and still have enough rigidity, which reduces the size of the microphone device 300.

In some embodiments, since the integrated circuit C2 of the microphone device 300 is designed as one of the components which forms the chambers CH31 and CH32 (e.g., the integrated circuit C2 is coupled to the microphone cover 301 and the circuit board 202), the wall structure generally utilized to form the chambers CH31 and CH32 is replaced by the part of the integrated circuit C2, which reduces the size of the microphone device 300.

In some embodiments, the chambers CH31 and CH32 are the same size. Furthermore, the arrangement of the acoustic sensor M1 and the integrated circuit C2 in the chamber CH31 is the same as the arrangement of the acoustic sensor M2 and the integrated circuit C2 in the chamber CH32. In such cases, the environment corresponding to the acoustic sensor M1 is substantially the same as the environment corresponding to the acoustic sensor M2. Therefore, when the integrated circuit C2 processes the signal received from the acoustic sensors M1 and M2 and performs a function related to the directivity of the microphone device 300, the effects caused by the difference between the environment of the acoustic sensors M1 and the environment of the acoustic sensor M2 can be reduced, which improves the accuracy of the directivity of the microphone device 300.

In some embodiments, the chambers CH31 and CH32 are the same size, and the arrangement of the acoustic sensor M1 and the integrated circuit C2 in the chamber CH31 is the same as the arrangement of the acoustic sensor M2 and the integrated circuit C2 in the chamber CH32. In such cases, the circuit arrangement in the chamber CH31 can be designed to be the same as the circuit arrangement in the chamber CH32 without placing an individual integrated circuit in each chamber (e.g., chambers CH31 and CH32). Therefore, the size of the microphone device 300 can be reduced.

Figure 4:
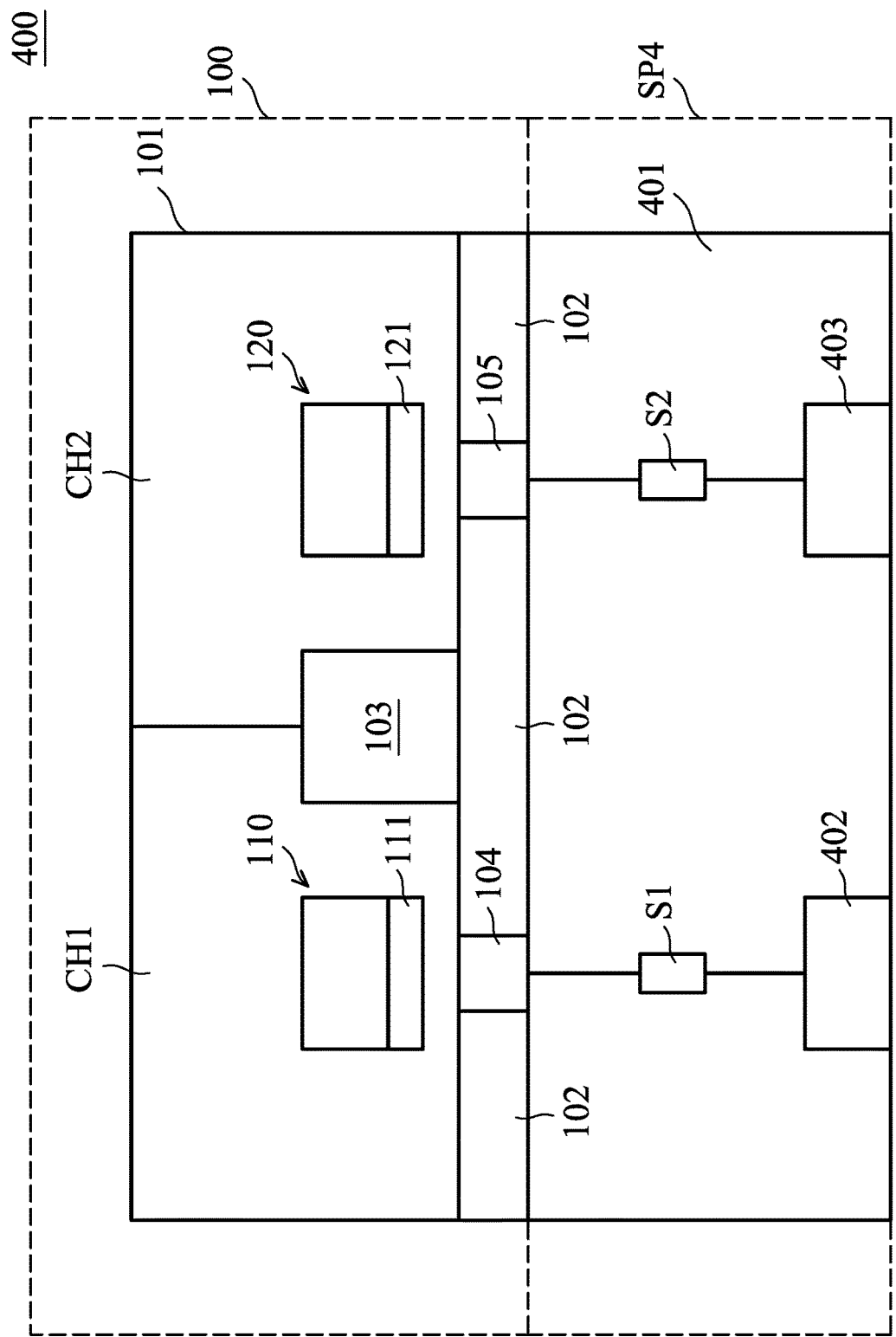
FIG. 4 is a schematic diagram of a microphone device according to some embodiments of the present disclosure.

FIG. 4 is a schematic diagram of the microphone device 400 according to some embodiments of the present disclosure. The microphone device 400 includes the microphone device 100 and the sound transmission device SP4. The sound transmission device SP4 is formed by the circuit board 401, and the sound transmission device SP4 includes the acoustic tube S1, acoustic tube S2, acoustic port 402, and acoustic port 403.

In some embodiments, the acoustic tube S1 communicates with the acoustic port 104 and the acoustic port 402, and the acoustic tube S2 communicates with the acoustic port 105 and the acoustic port 403. In some embodiments, the length difference between the acoustic tube S1 and the acoustic tube S2 can be utilized to design the directivity of the microphone device 400. In some embodiments, the cross-sectional area difference between the acoustic tube S1 and the acoustic tube S2 can be utilized to design the directivity of the microphone device 400.

In some embodiments, the length difference between the acoustic tube S1 and the acoustic tube S2 can be utilized to design the sensitivity difference between the acoustic sensors 110 and 120. In some embodiments, the cross-sectional area difference between the acoustic tube S1 and the acoustic tube S2 can be utilized to design the sensitivity difference between the acoustic sensors 110 and 120.

In some embodiments, the sound wave may be transmitted to the diaphragm 111 through the acoustic port 402, the acoustic tube S1, and the acoustic port 104, and the sound wave may be transmitted to the diaphragm 121 through the acoustic port 403, the acoustic tube S2, and the acoustic port 105. If the length of the acoustic tube S1 is different than the length of the acoustic tube S2, the sound degradation caused by the acoustic tube S1 and that caused by the acoustic tube S2 are different (e.g., the longer length causes greater loss), which makes the sensitivity of the acoustic sensor 110 different from the sensitivity of the acoustic sensor 120 and increases the dynamic range of the microphone device 400. In some embodiments, the length of the acoustic tube S1 is different from the length of the sound guide tube S2, and the integrated circuit 103 can dynamically adjust the volume gain of the microphone device 400, which can perform AOP 140 dB.

In some embodiments, if the acoustic tube S1 and the acoustic tube S2 have different cross-sectional areas, the sound degradation caused by the acoustic tube S1 and that caused by the acoustic tube S2 are different. Therefore, the sensitivity of the acoustic sensor 110 is different from the sensitivity of the acoustic sensor 120, which improves the directivity of the microphone device 400 and improves the ability of receiving sound.

Figure 5:
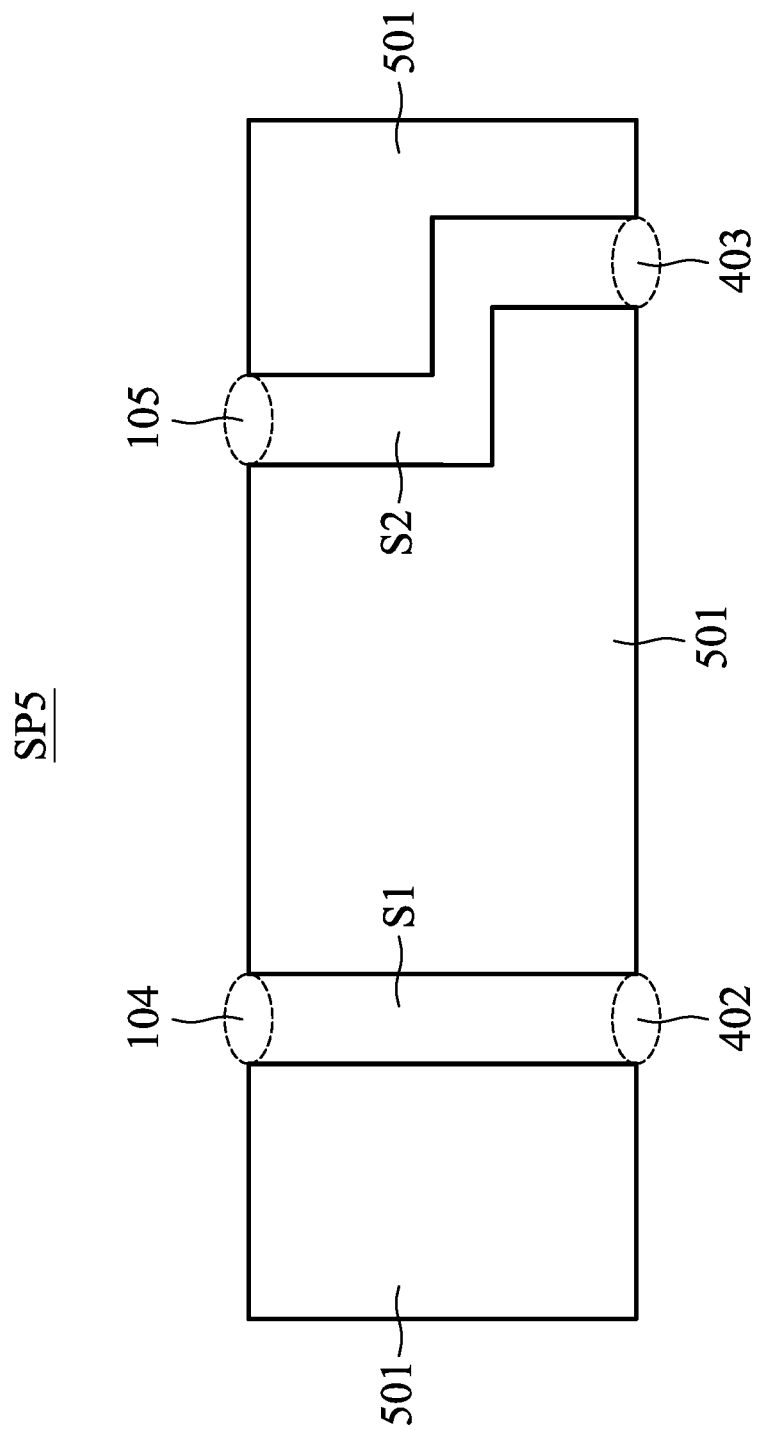
FIG. 5 is a schematic diagram of a sound transmission device according to some embodiments of the present disclosure.

In some embodiments, the circuit board 102 and the circuit board 401 can be integrated as a multilayer circuit board, as the circuit board 501 shown in FIG. 5. The sound transmission device SP5 in FIG. 5 is formed by the circuit board 501, and the circuit board 501 includes the acoustic port 104, acoustic port 105, acoustic tube S1, acoustic tube S2, acoustic port 402, and acoustic port 403.

Figure 6A:
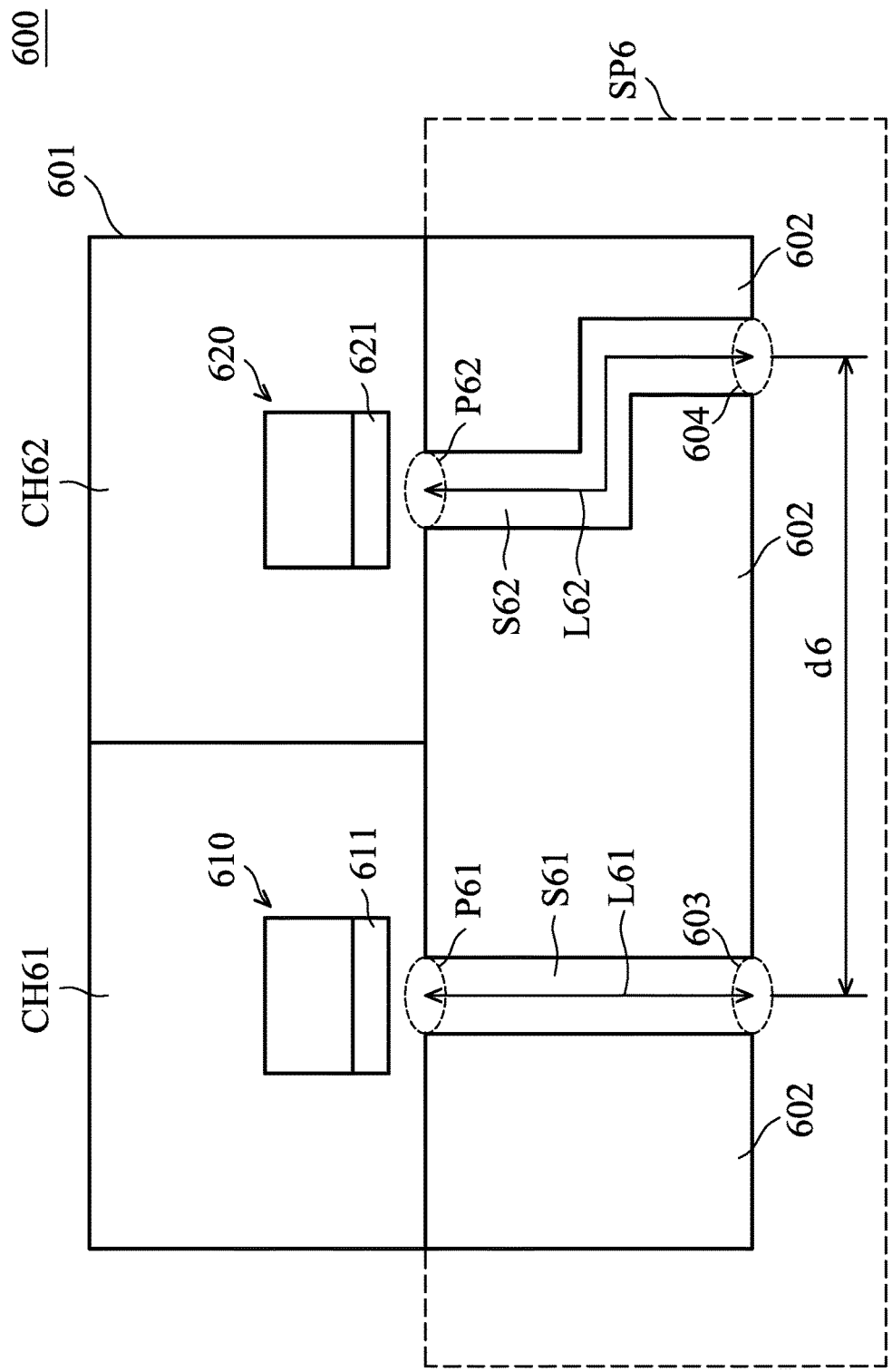
FIG. 6A is a schematic diagram of a microphone device according to some embodiments of the present disclosure.

In some embodiments, the microphone device 400 may be implemented as the microphone device 600 shown in FIG. 6A. The microphone device 600 includes the microphone cover 601, the acoustic sensor 610, the acoustic sensor 620, and the sound transmission device SP6.

The microphone cover 601 and the sound transmission device SP6 form the chambers CH61 and CH62. In some embodiments, an integrated circuit may be configured to be coupled to the microphone cover 601 and the circuit board 602, which forms the chambers CH61 and CH62, such as the microphone device 100.

The sound transmission device SP6 is formed by the circuit board 602, and the sound transmission device SP6 includes the acoustic tube S61, the acoustic tube S62, the acoustic port P61, the acoustic port P62, the acoustic port 603, and the acoustic port 604. The acoustic tube S61 communicates with the acoustic port P61 and the acoustic port 603, and the acoustic tube S62 communicates with the acoustic port P62 and the acoustic port 604. The acoustic sensor 610 includes diaphragm 611, and the position of the acoustic port P61 corresponds to the position of the diaphragm 611. The acoustic sensor 620 includes diaphragm 621, and the position of the acoustic port P62 corresponds to the position of the diaphragm 621.

As shown in FIG. 6A, the length L61 between the acoustic ports P61 and 603 is shorter than the length L62 between the acoustic ports P62 and 604. Accordingly, the sound path (or propagation path) of the sound transmitted to the diaphragm 611 through the acoustic tube S61 is shorter than the sound path of the sound transmitted to the diaphragm 621 through the acoustic tube S62. Based on the distance d6 and the length difference between the acoustic tube S61 and the acoustic tube S62 (i.e., the difference between the length L61 and the length L62), the sound may substantially reach both the diaphragm 611 and the diaphragm 621 at the same time if the sound is substantially transmitted in a specific direction. In such cases, the acoustic tube S61 and the acoustic tube S62 may determine the directivity of the microphone device 600. In some embodiments, the distance d6 is the distance between the central points of the acoustic ports 603 and 604.

Since the sound path of the acoustic tube S62 is longer than the sound path of the acoustic tube S61, the sound degradation caused by the acoustic tube S62 is greater than the sound degradation caused by the acoustic tube S61. In such cases, the sensitivity of the acoustic sensor 610 is different from the sensitivity of the acoustic sensor 620, which allows the microphone device 600 to support two different sensitivities and gives the microphone device 600 a wider dynamic range. In some embodiments, the microphone device 600 can have a wider dynamic range by further adjusting the volume gain of the microphone device 600 through the integrated circuit thereof. Therefore, the acoustic tubes S61 and S62 can be utilized to design the directivity and sensitivity of the microphone device 600.

In some embodiments, the acoustic tube S61 and the acoustic tube S62 may have different cross-sectional areas. Since different cross-sectional areas cause different sound degradations, the dynamic range and the directivity of the microphone device 600 can be designed based on cross-sectional areas of the acoustic tube S61 and the acoustic tube S62.

Figure 6B:
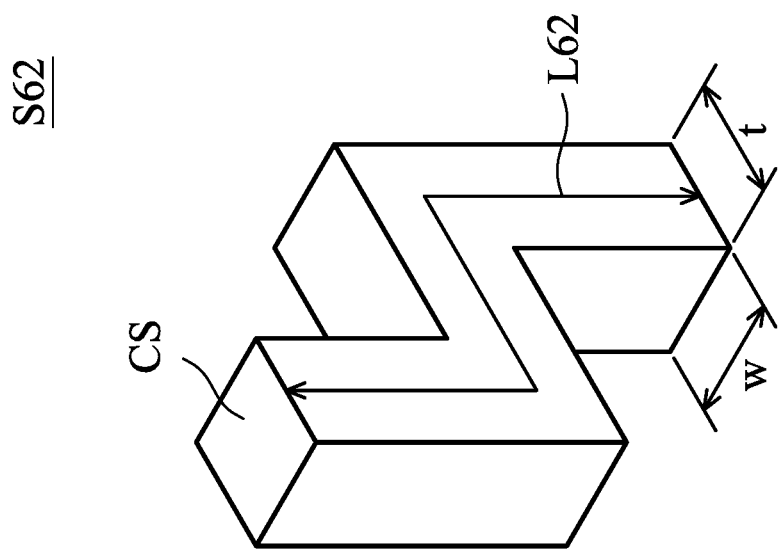
FIG. 6B is a schematic diagram of an acoustic tube according to some embodiments of the present disclosure.

FIG. 6B illustrates the acoustic tube S62. If the cross-sectional area CS of the acoustic tube S62 becomes larger (i.e. the length t or the length w becomes longer), then the acoustic tube S62 receives more sound energy and then reduces the sound degradation caused by the acoustic tube S62, as shown in FIGS. 6C-6D.

Figure 6C:
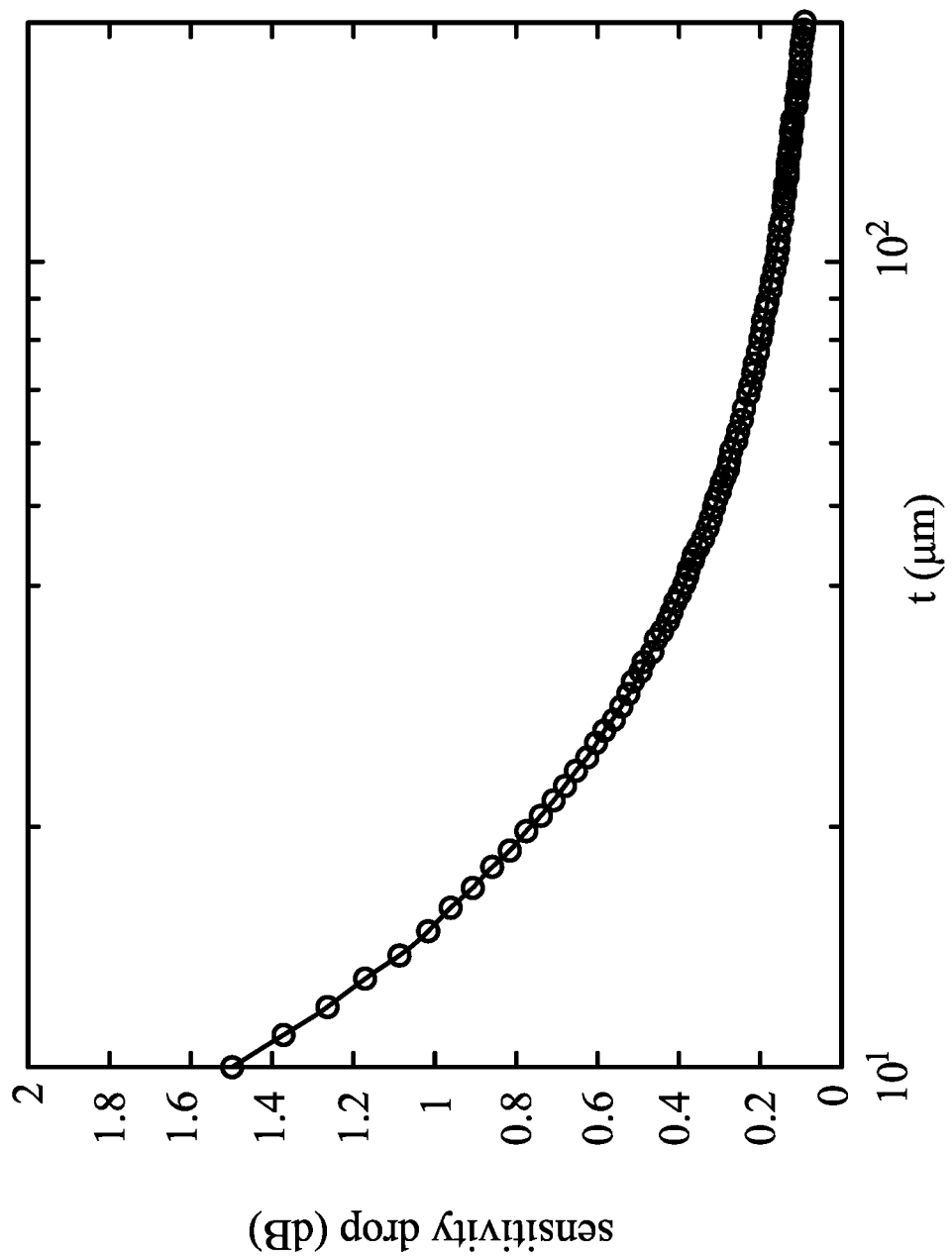
FIG. 6C-6D is a chart illustrating the relationship between the cross-sectional area of the acoustic tube and the sensitivity of the microphone according to some embodiments of the present disclosure.
Figure 6D:
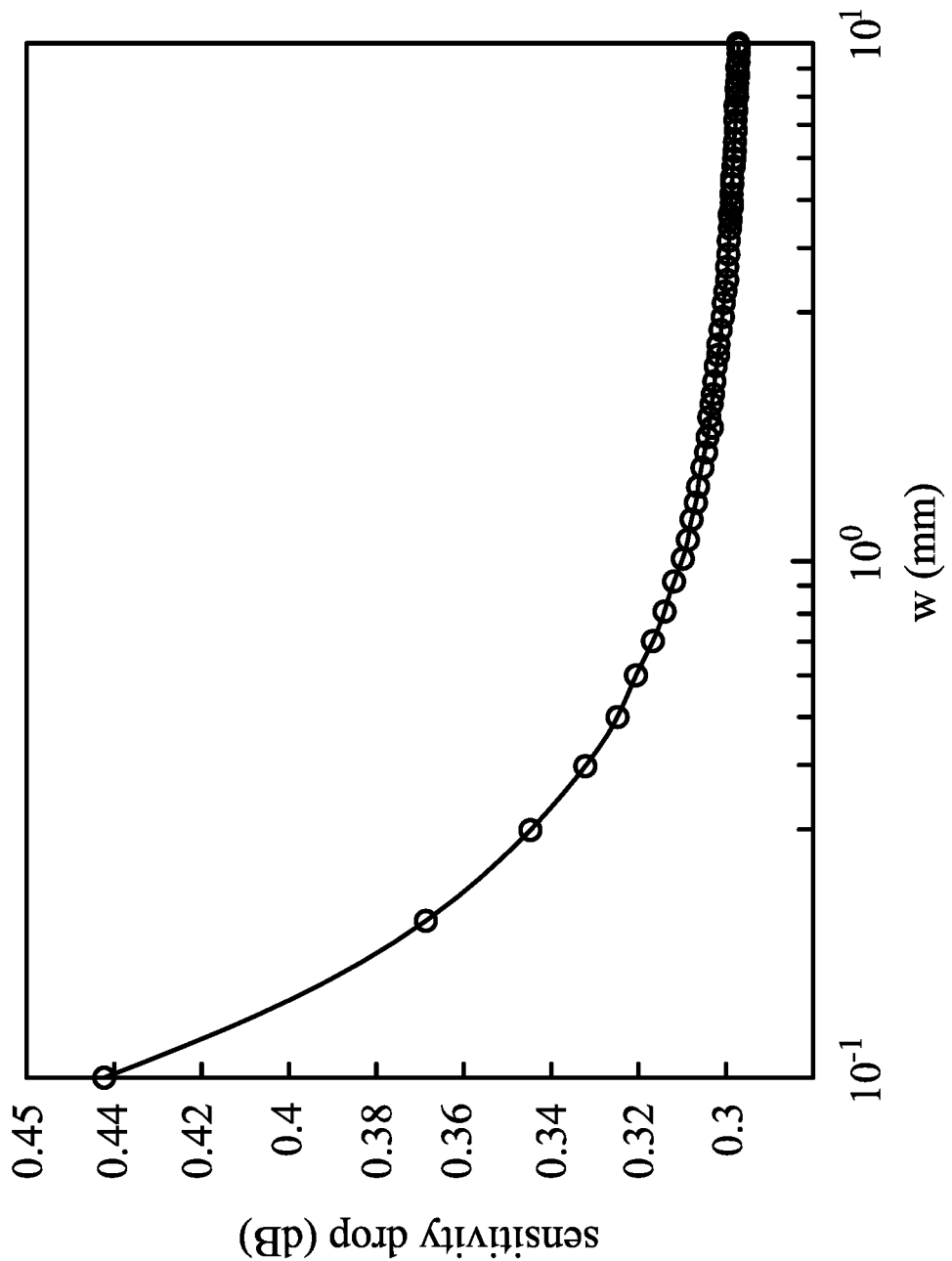

FIG. 6C is a chart showing the relationship between the length t and the sensitivity of the acoustic sensor 620 when the length w and length L62 of the acoustic tube S62 are 0.8 mm and 0.85 mm, respectively. As shown in FIG. 6C, the sensitivity degradation (or the sensitivity drop) of the acoustic sensor 620 is reduced (i.e., the sensitivity is improved) when the length t is increased (i.e. the cross-sectional area CS is increased). Similarly, FIG. 6D is a chart showing the relationship between the length w and the sensitivity of the acoustic sensor 620 when the length L62 and length t of the acoustic tube S62 are 0.085 mm and 0.05 mm, respectively. As shown in FIG. 6D, the sensitivity degradation of the acoustic sensor 620 is reduced when the length w is increased. In some embodiments, the cross-sectional area Cs may be any shape.

Figure 6E:
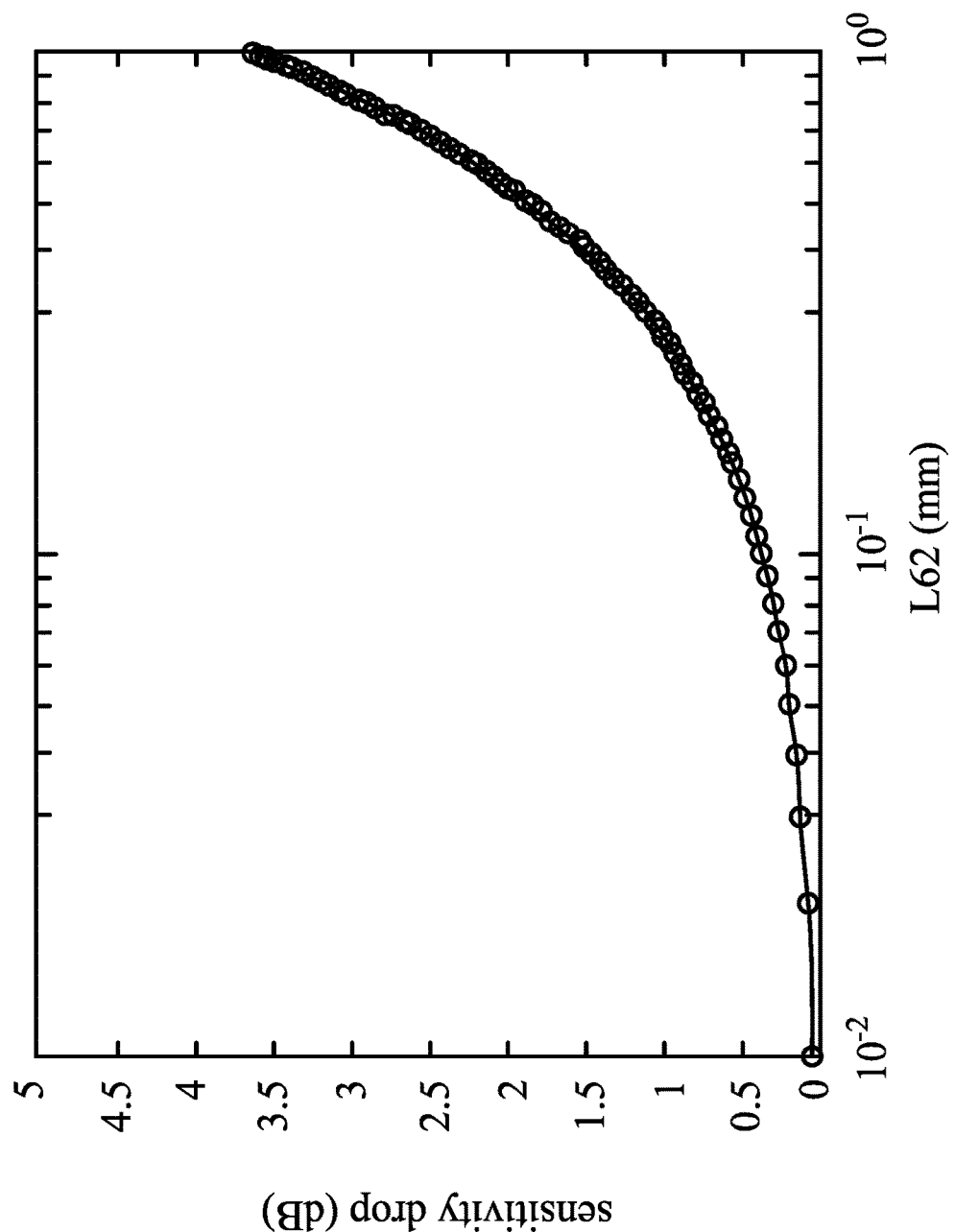
FIG. 6E is a chart illustrating the relationship between the length of the acoustic tube and the sensitivity of the microphone according to some embodiments of the present disclosure.

If the length L62 of the acoustic tube S62 becomes longer, then the sound path in the acoustic tube S62 also become longer, which increases the sound degradation caused by the acoustic tube S62, as shown in FIG. 6E. FIG. 6E is a chart showing the relationship between the length L62 and the sensitivity of the acoustic sensor 620 when the length w and the length t of the acoustic tube section S62 are 1.1 mm and 0.05 mm, respectively. As shown in FIG. 6E, the sensitivity degradation (or the sensitivity drop) of the acoustic sensor 620 is increased (i.e., the sensitivity is degraded) when the length L62 is increased.

Figure 6F:
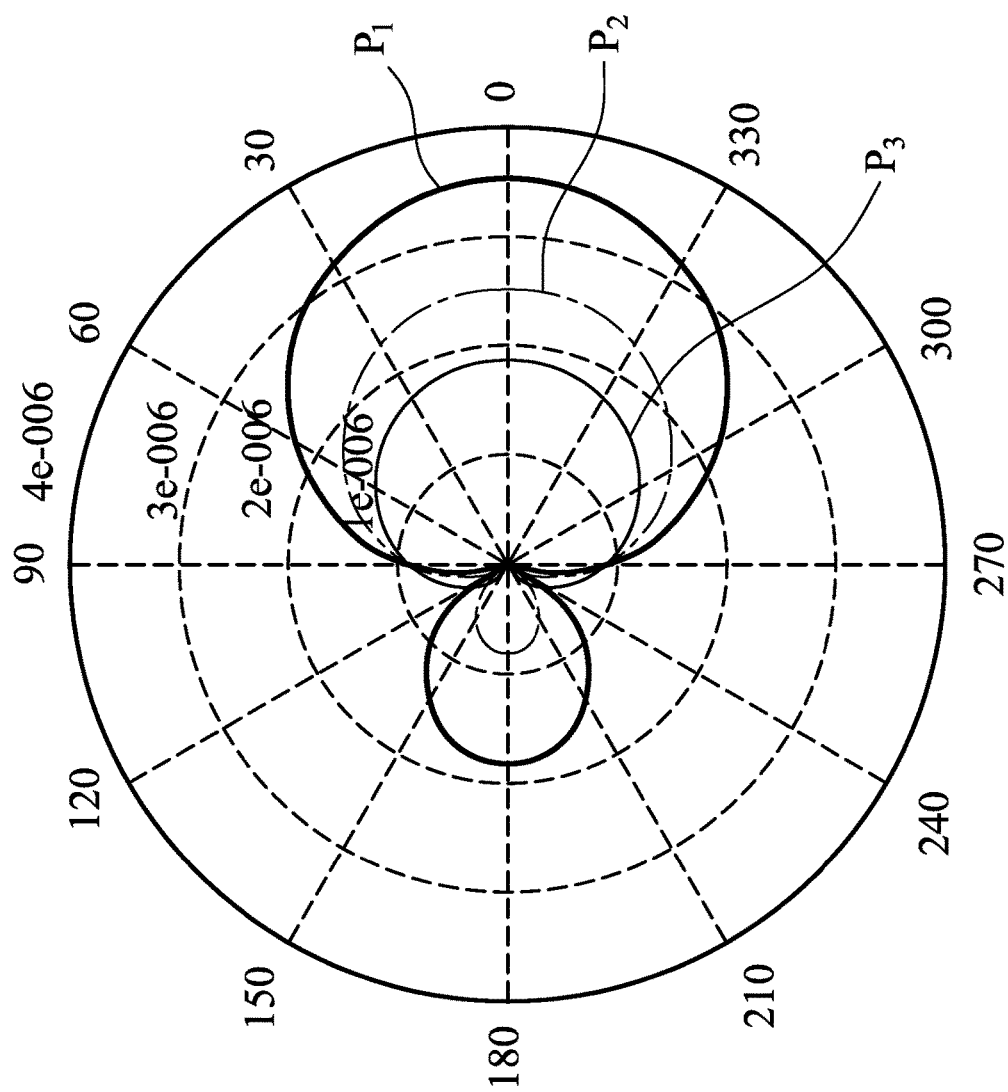
FIG. 6F is a polarity pattern illustrating the relationship between the length of the acoustic tube and the directivity of the microphone according to some embodiments of the present disclosure.

In some embodiments, the directivity of the microphone device 600 can be designed based on the difference between the length L61 of the acoustic tube S61 and the length L62 of the acoustic tube S62, as shown in FIG. 6F. FIG. 6F shows the polarity pattern P1 of the microphone device 600 having a difference of 8 mm between lengths L61 and L62, the polarity pattern P2 of the microphone device 600 having a difference of 6 mm between lengths L61 and L62, and the polarity pattern P3 of the microphone device 600 having a difference of 3 mm between lengths L61 and L62. As shown in FIG. 6F, the directivity of the microphone device 600 increases as the difference between the length L61 and the length L62 increases. For example, the bi-directional-microphone function performed by the polarity patterns P1 is more obvious than that performed by the polarity patterns P2.

Figure 6G:
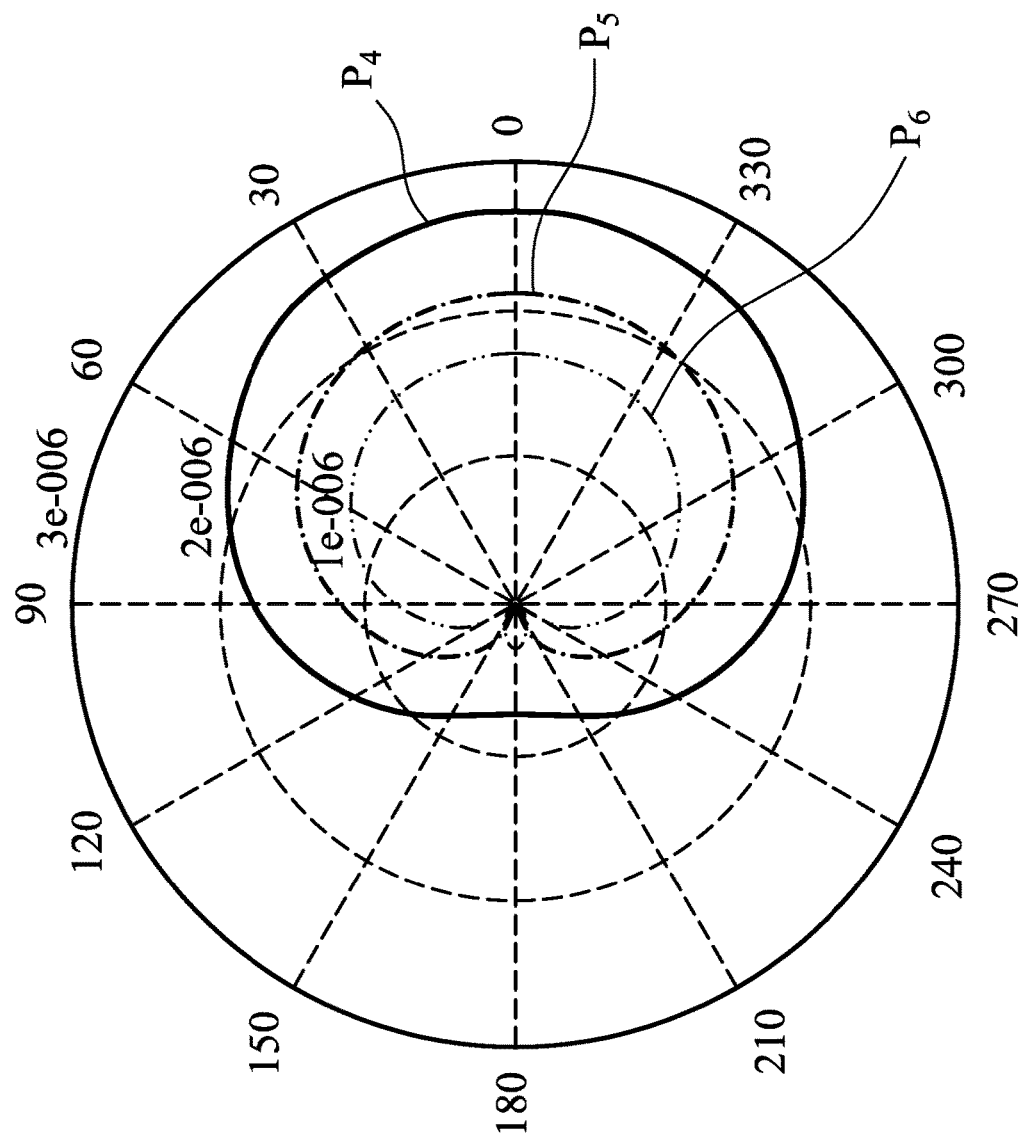
FIG. 6G is a polarity pattern illustrating the relationship between the cross-sectional area of the acoustic tube and the directivity of the microphone according to some embodiments of the present disclosure.

In some embodiments, the directivity of the microphone device 600 can be designed based on the cross-sectional area difference between the acoustic tube S61 and the acoustic tube S62, as shown in FIG. 6G. FIG. 6G shows the polarity pattern P4 of the microphone device 600 having the cross-sectional area of the acoustic tube S62 which is equal to the cross-sectional area of the acoustic tube S61, the polarity pattern P5 of the microphone device 600 having the cross-sectional area of the acoustic tube S62 which is 2 times larger than the cross-sectional area of the acoustic tube S61 and the polarity pattern P6 of the microphone device 600 having the cross-sectional area of the acoustic tube S62 which is 4 times larger than the cross-sectional area of the acoustic tube S61. As shown in FIG. 6G, the directivity of the microphone device 600 can be designed based on cross-sectional area difference between acoustic tube S61 and acoustic tube S62.

Figure 7A:
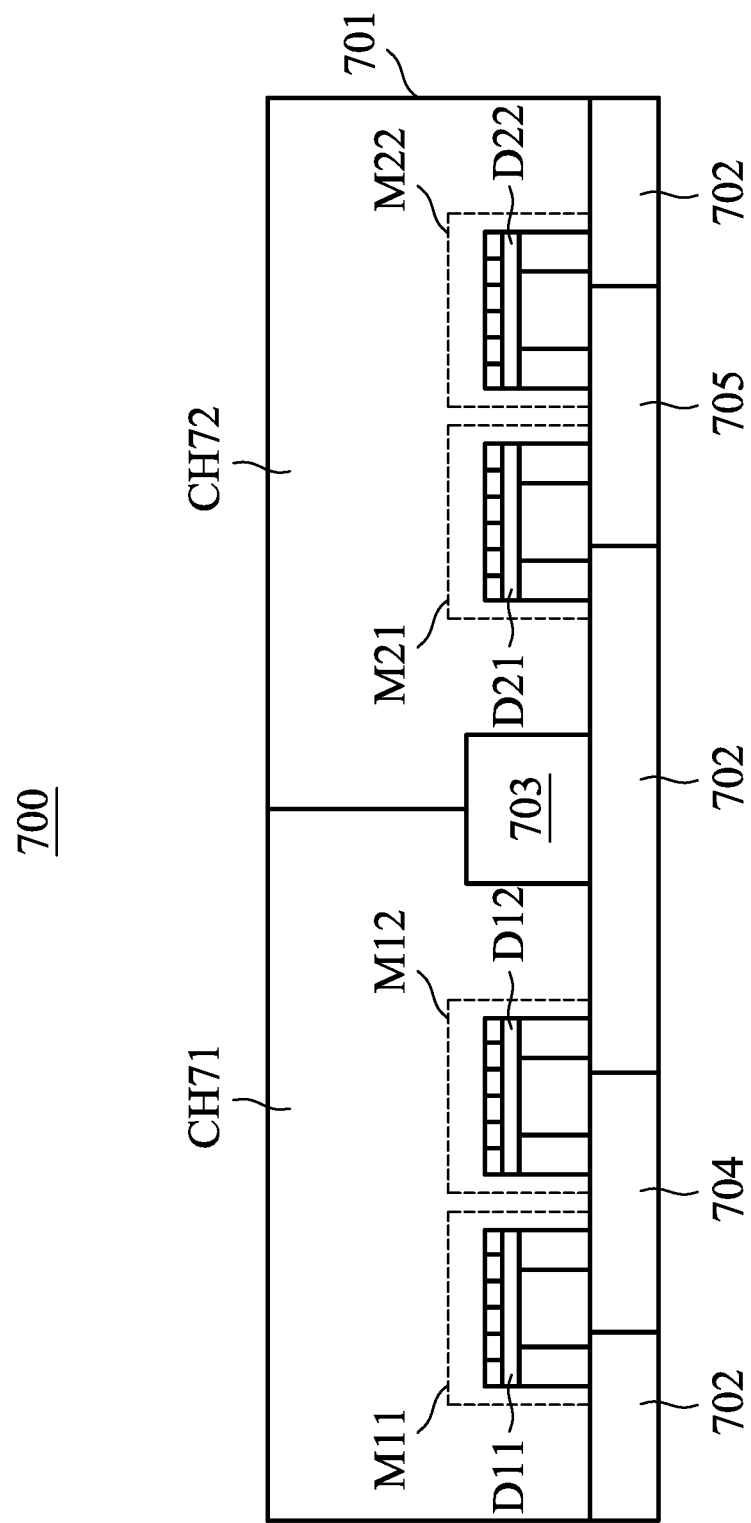
FIG. 7A-7B are schematic diagrams of a microphone device according to some embodiments of the present disclosure.

In some embodiments, two acoustic sensors may be placed inside one chamber, which increases the equivalent diaphragm size to improve the sensitivity of the microphone device. FIG. 7A is a schematic diagram of the microphone device 700 according to some embodiments of the present disclosure. The microphone device 700 includes the microphone cover 701, circuit board 702, integrated circuit 703, and acoustic sensors M11, M12, M21, and M22. The integrated circuit 703 is coupled to the microphone cover 701 and circuit board 702 to form the chamber CH71 and chamber CH72. The acoustic sensor M11 and acoustic sensor M12 in the chamber CH71 include the diaphragm D11 and diaphragm D12, respectively. The acoustic sensor M21 and acoustic sensor M22 in the chamber CH72 include the diaphragm D21 and diaphragm D22, respectively. The circuit board 702 is coupled to the microphone cover 701, and the circuit board 702 includes the acoustic port 704 and acoustic port 705.

Figure 7B:
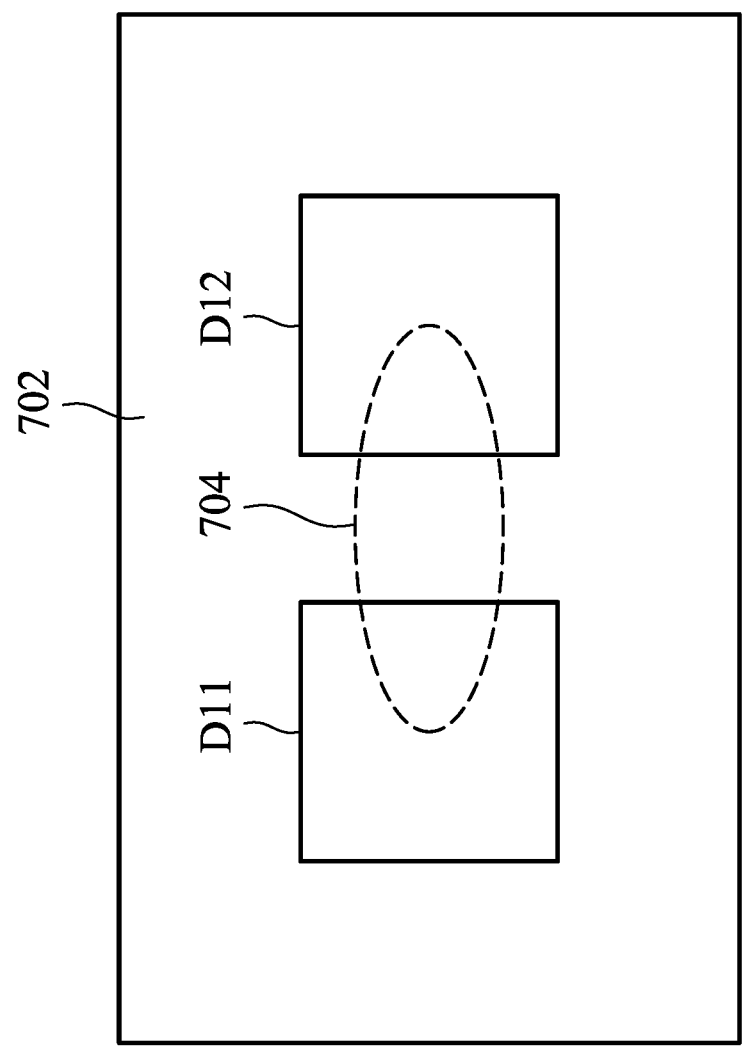

In some embodiments, the integrated circuit 703 is coupled to the acoustic sensors M11, M12, M21, and M22 and controls the acoustic sensors M11, M12, M21, and M22. In some embodiments, the arrangement of the diaphragm D11, diaphragm D12, and the acoustic port 704 of the circuit board 702 is shown in FIG. 7B (top view). It should be understood that the shapes of the diaphragm D11, diaphragm D12, and the acoustic port 704 are not limited to the embodiment shown in FIG. 7B.

As shown in FIG. 7A, the chambers CH71 and CH72 of the microphone device 700 each have two acoustic sensors. Therefore, the microphone device 700 may have excellent sensitivity for detecting sound. To reduce the size of the microphone device 700 which has multiple acoustic sensors, the integrated circuit 703 of the microphone device 700 is designed as one of the components which forms the chambers CH71 and CH72 (e.g., the integrated circuit 703 is coupled to the microphone cover 701 and the circuit board 702). In such cases, the wall structure generally utilized to form the chambers CH71 and CH72 is replaced by part of the integrated circuit 703, which reduces the size of the microphone device 700.

In some embodiments, the chambers CH71 and CH72 are the same size. Furthermore, the arrangement of the acoustic sensor M11, acoustic sensor M12, and the integrated circuit 703 in the chamber CH71 is the same as the arrangement of the acoustic sensor M21, acoustic sensor M22, and the integrated circuit 703 in the chamber CH72. In such cases, the circuit arrangement in the chamber CH71 can be designed to be the same as the circuit arrangement in the chamber CH72 without placing an individual integrated circuit in each chamber (e.g., chambers CH71 and CH72). Therefore, the size of the microphone device 700 can be reduced.

According to the aforementioned embodiments, the size of the microphone device 700 which has two acoustic sensors in one chamber can be reduced by using the package structure formed by the microphone cover 701, integrated circuit 703, and circuit board 702. In such cases, the applications of the microphone device 700 can be expanded.

Figure 8:
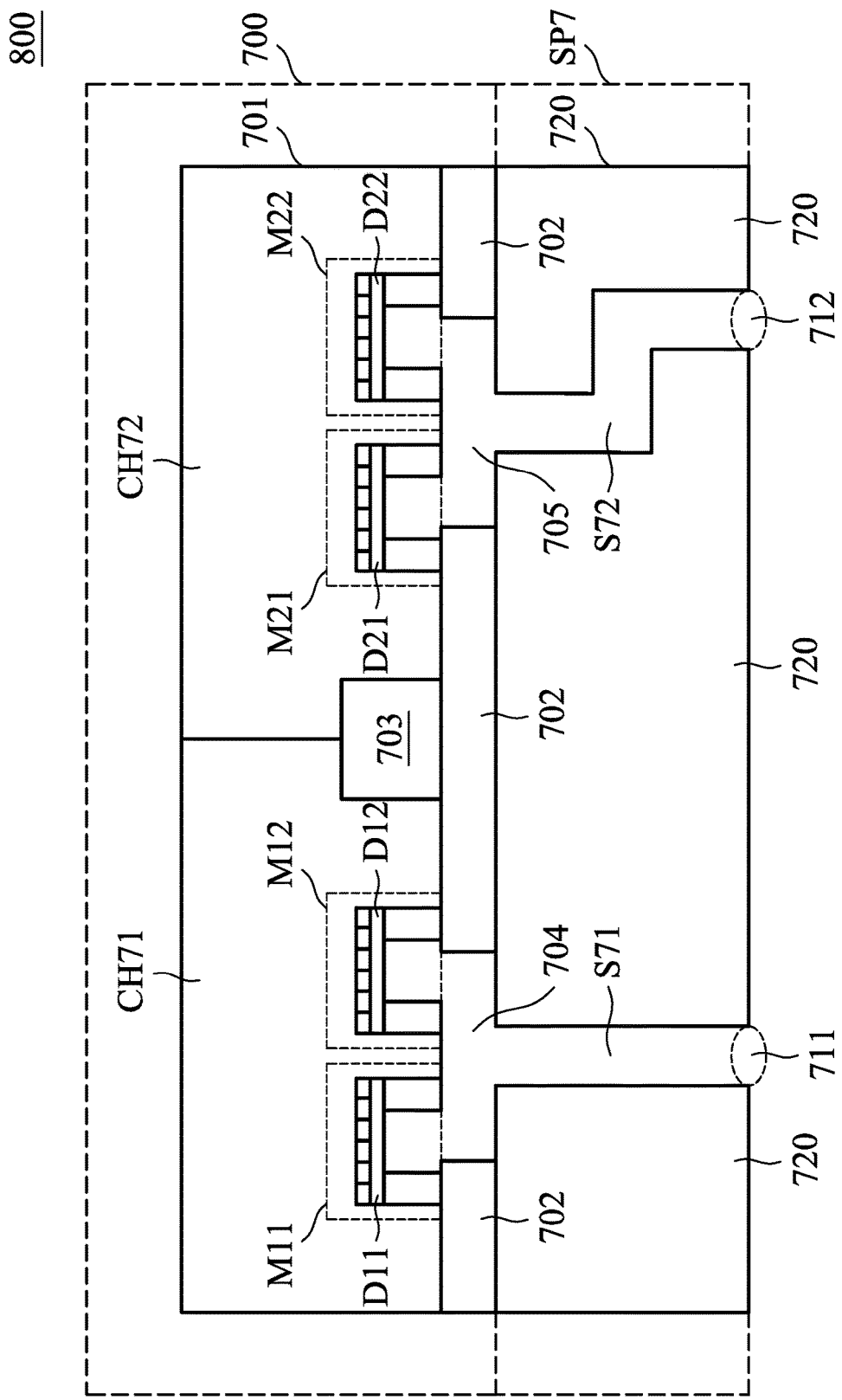
FIG. 8 is a schematic diagram of a microphone device according to some embodiments of the present disclosure.

FIG. 8 is a schematic diagram of the microphone device 800 according to some embodiments of the present disclosure. The microphone device 800 includes the microphone device 700 and the sound transmission device SP7. The sound transmission device SP7 is formed by circuit board 720 and includes the acoustic tube S71, acoustic tube S72, acoustic port 711, and acoustic port 712. In this embodiment, the cross-sectional areas of the acoustic tubes S71 and S72 and the areas of the acoustic ports 711 and 712 are smaller than the areas of the acoustic ports 704 and 705, which reduces the amount of dust (from the outside of the microphone device 800) entering the acoustic sensors M11, M12, M21, and M22.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A microphone device, comprising:
a microphone cover;
a circuit board coupled to the microphone cover, comprising a first acoustic port and a second acoustic port;
an integrated circuit, coupled to the microphone cover and the circuit board to form a first chamber and a second chamber;
a first acoustic sensor, placed inside the first chamber;
a second acoustic sensor, placed inside the second chamber; and
a sound transmission device, comprising:
a third acoustic port;
a fourth acoustic port;
a first acoustic tube, communicating with the first acoustic port and the third acoustic port; and
a second acoustic tube, communicating with the second acoustic port and the fourth acoustic port;
wherein the integrated circuit is coupled to the first acoustic sensor and the second acoustic sensor.

2. The microphone device as claimed in claim 1, wherein the integrated circuit provides a first voltage to the first acoustic sensor and provides a second voltage to the second acoustic sensor;
wherein a sensitivity difference between the first acoustic sensor and the second acoustic sensor is determined based on the first voltage and the second voltage.

3. The microphone device as claimed in claim 1, wherein the microphone cover is made of metal and has a groove;
wherein the integrated circuit is coupled to the circuit board and the groove of the microphone cover to form the first chamber and the second chamber.

4. The microphone device as claimed in claim 1, wherein the integrated circuit comprises a first electronic circuit and a second electronic circuit;
wherein the first electronic circuit and the second electronic circuit are coupled to each other by using a flip-chip technique;
wherein the microphone cover is coupled to the first electronic circuit, and the circuit board is coupled to the second electronic circuit.

5. The microphone device as claimed in claim 1, further comprising:
a third acoustic sensor, placed inside the first chamber; and
a fourth acoustic sensor, placed inside the second chamber;
wherein the integrated circuit is coupled to the third acoustic sensor and the fourth acoustic sensor.

6. The microphone device as claimed in claim 1, wherein a size of the first chamber and a size of the second chamber are the same;
wherein arrangement of the first acoustic sensor in the first chamber is the same as arrangement of the second acoustic sensor in the second chamber.

7. The microphone device as claimed in claim 1, wherein the integrated circuit comprises a digital circuit and an analog circuit;
wherein based on parameters corresponding to environment outside the microphone device, the digital circuit automatically changes a noise-to-signal ratio, a dynamic range, and a direction or an angle of directivity of the microphone device through at least one algorithm;
wherein the analog circuit provides the same or different voltages to the first acoustic sensor and the second acoustic sensor to adjust sensitivity and volume gain of the microphone device.

* * * * *